United States Patent [19]

Tanaka

[11] 4,152,654
[45] May 1, 1979

[54] MEMORY-SAVING ALL CHANNEL DIGITAL TUNING SYSTEM

[75] Inventor: Akio Tanaka, Chicago, Ill.

[73] Assignee: Zenith Radio Corporation, Glenview, Ill.

[21] Appl. No.: 807,627

[22] Filed: Jun. 17, 1977

[51] Int. Cl.² .............................................. H04B 1/26
[52] U.S. Cl. ................................... 325/459; 325/464; 325/468; 334/15
[58] Field of Search ............... 325/453, 459, 464, 468, 325/420–422; 334/11, 14, 15; 358/191

[56] References Cited
U.S. PATENT DOCUMENTS

| 3,715,687 | 2/1973 | Solender | 325/453 |
| 3,940,702 | 2/1976 | Yoshimura et al. | 325/464 |

*Primary Examiner*—Robert L. Griffin
*Assistant Examiner*—Marc E. Bookbinder
*Attorney, Agent, or Firm*—Nicholas A. Camasto

[57] ABSTRACT

A tuning system for a television receiver includes fine tune memories and tuning information memories having reference channel nominal tuning information for each frequency band and increment tuning information representing the tuning voltage differences between successive channels. Accumulator means add the reference channel tuning information and increment information to develop the nominal tuning voltage for any selected channel. Control logic, including channel number counters and latches and state counters, is coupled to the accumulator means, tuning information memories and the fine tune memories. The memories' and accumulator means' outputs are coupled to a corresponding plurality of comparators which are also coupled to counters for deriving pulse-width modulated (PWM) signals corresponding to tuning information in the accumulator means and memories. The PWM signals are supplied to a tuning voltage generator where they are combined to produce the final tuning voltage for the tuner. The increment tuning information is representative of the slope of the tuning curve at each of the channel tuning points and is used to equalize any auxiliary tuning voltage source. The final tuning voltage consists of the derived nominal tuning voltage combined with the product of the fine tune voltage and channel increment tuning information.

19 Claims, 9 Drawing Figures

MEMORY-SAVING ALL CHANNEL DIGITAL TUNING SYSTEM

This application is related to, but in no way dependent upon the invention and apparatus disclosed in copending application Ser. No. 791,897 filed Apr. 28, 1977 in the name of Akio Tanaka and assigned to Zenith Radio Corporation.

Field of the Invention

This invention relates generally to digital tuning systems and in particular to all-electronic television receiver digital tuning systems having a memory for storing tuning information.

Background of the Invention and Prior Art

Varactor diode tuners have contributed to the simplification of tuning systems in general, and television receiver tuning systems in particular. In such tuners, which are often referred to as electronic tuners, the varactor diodes exhibit capacitance variations with changes in bias voltage and serve as the variable reactances in-otherwise-conventional tuned circuits. Such tuning systems are easy to tune, free from RF signal carrying contacts and afford the designer great versatility in receiver styling. As pointed out in the related application above, their most serious drawbacks are the limited range of diode capacitance change and the nonlinear relationship between frequency and bias voltage. The Federal Communications Commission so-called "equal tuning" rule for VHF and UHF television channels added difficulty to an already formidable problem.

The invention in the related application provides an attractive solution to these problems. In brief, that system produces a separate "slope factor" which is related to the slope of the tuning voltage-versus-frequency characteristic for proportioning the "fine" tuning voltage such that equal frequency excursions are experienced for equal tuning information increments. The result is a truly "equalized" tuning system. In the environment of the above invention the slope factors are stored in appropriate memories as are the nominal (coarse) tuning informations and fine tuning informations. The memories are channel number addressed. For each channel selection a nominal tuning voltage information, a fine tuning voltage information and a slope factor are produced. The fine tuning information is multiplied by the slope factor and combined with the nominal tuning information for conversion to the final tuning voltage.

The present invention is particularly concerned with memory utilization in digital tuning systems and the savings in memory which may be achieved by proper utilization of the slope factor. As is well-known, the number of bits of information which must be stored is determinative of memory size and complexity which, in turn, impacts heavily on tuning system economics. It is thus important to minimize memory size wherever possible. The structure of the invention accomplishes significant memory reduction.

With the exception of four discontinuities between the low VHF (channels 2-4), mid VHF (5, 6), high VHF (7-13) and UHF (14-83), adjacent channel numbers represent 6 MHz increments in frequency. The memory saving aspect of the invention is based upon storing reference or initial value tuning information for a reference or pseudo channel in each frequency band and separate tuning increment information, representing the tuning voltage changes required to successively tune from one channel to the next, beginning with the reference or pseudo channel. These increments are the difference equation analog of the slope factors defined in the related application. Upon channel changes, an arithmetic computation is performed in which the initial value information and successive increment informations are added. The initial value tuning information is selected at a point 6 MHz below the lowest numbered channel in the band which point is then referred to as the pseudo channel number. Thus, in the low VHF band, for instance, rather than storing complete information words corresponding to the nominal tuning information for channels 2-4, the nominal tuning information for pseudo channel 1 is stored along with the slope factors or increments required to go from pseudo channel 1 to real channel 2, from channel 2 to channel 3, and from channel 3 to channel 4. Suitable logic and apparatus are provided for summing the pseudo channel information and successive increments for obtaining the nominal tuning information corresponding to the selected channel number.

Since the last increment represents the slope factor of the tuning curve at the selected channel, and since this slope information is separately available, it is readily usable for equalization of any auxiliary tuning voltage source to provide true equalized tuning for the system, as disclosed in the referent application. In the offset fine tuning system disclosed, one-half of the fine tune information, after equalization, is added to the derived nominal tuning information to produce the final tuning information for the selected channel.

There is no art known to the inventor which is relevant to the invention described and claimed; that is a system which "computes" a tuning voltage by algebraic summation of nominal tuning information for a reference channel and increment tuning information representative of tuning differences between channels.

Objects of the Invention

The principal object of this invention is to provide a novel television tuning system.

Another object of this invention is to provide a television tuning system requiring less memory.

SUMMARY OF THE INVENTION

In accordance with the invention a television receiver includes a voltage controlled tuner having a nonlinear tuning voltage-versus-frequency characteristic, tuning voltage means for generating a tuning voltage for the tuner and memory means storing both reference tuning information and increment tuning information related to the slope of the characteristic at each channel. The reference tuning information comprises the nominal tuning information for a reference channel and the increment tuning information comprises the tuning information changes to tune from one channel to an adjacent channel. The memory means supply the tuning informations to accumulator means which generate therefrom the nominal tuning information for the selected channel by algebraically adding successive tuning information increments to the reference tuning information.

BRIEF DESCRIPTION OF THE DRAWINGS

The invention and its objects will best be understood by reference to the detailed description of the preferred embodiment thereof in conjunction with the drawings in which.

IC Details

IC DM8130 is available from National Semiconductor Corporation of Santa Clara, Calif. All others are available from Texas Instruments Corporation of Dallas, Tex.

The schematic diagrams have been simplified to aid in describing the invention. All integrated circuits used are "off-the-shelf" items obtainable under the given designations from the identified sources. Only terminals that change logic states are shown. All $V_{CC}$ terminals are connected to 5 volts D.C. and all ground terminals are connected to 0 volts. Unused outputs are left open. Device pin numbers have not been used since they are nondescriptive and difficult to follow. Some terminal designations are abbreviated; in the memories, any $A_0$–$A_7$ terminals are referred to as $A_A$–$A_H$ for consistency.

Input terminals that do not change logic states are connected as follows:

| Device | Ref. # | Description | Inputs to 0v. | Inputs to 5v. |
|---|---|---|---|---|
| DM8130 | 301 | comparator | $S, A_0, A_9, B_0$ | |
| SN7475 | 302,303 | latch | | |
| SN74190 | 304,305 | counter | $D_A, D_B, D_C, D_D, EG$ | |
| SN74393 | 321,322 | binary counter | | |
| Sn74S139 | 323,324 | decoder | $E1G, E2G$ | |
| Sn74S281 | 402-404 | accumulator | $M, C_n, RC, RS1, \overline{RSO}$ | $AS1$ |
| SN74S287 | 412-414 | memory | $\overline{CS1}, \overline{CS2}$ | |
| SN74161 | 422-424 | binary counter | $A,B,C,D,$ | $EP, ET, CL, L$ |
| SN7485 | 432-434, 442-444, 532,533 | comparator | $A<B, A>B$ | $A=B$ |
| TMS2101 | 512,513 | memory | $\overline{CE1}, \overline{OE}$ | $CE2$ |
| SN74191, | 522,523 | binary counter | $EG$ | |

DESCRIPTION OF THE PREFERRED EMBODIMENT

SYSTEM BLOCK DIAGRAM (FIG. 1)

Figure 1:
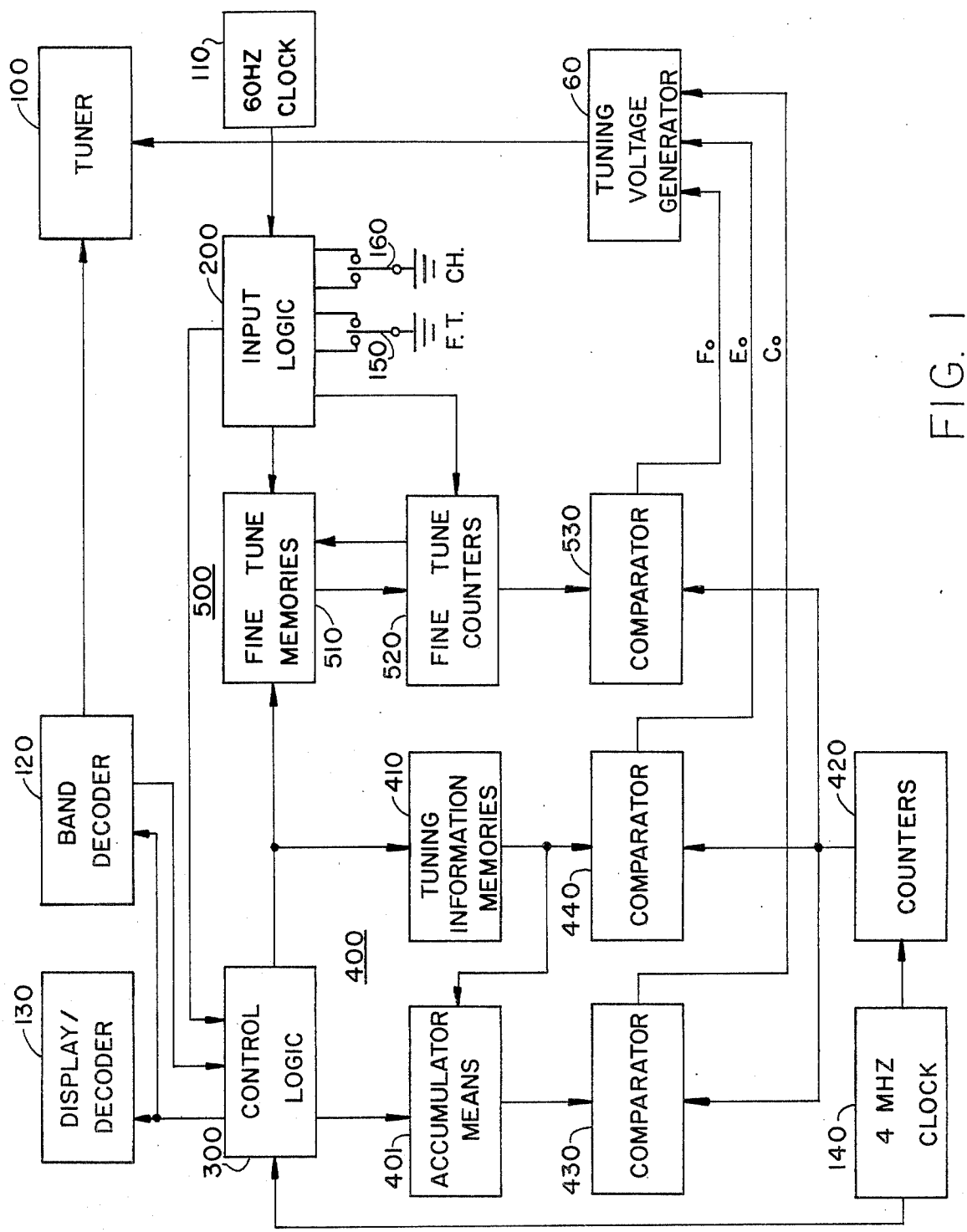
FIG. 1 is a block diagram of a television tuning system constructed in accordance with the invention.

In FIG. 1 a television tuning system includes a tuner 100, a tuning voltage generator 60, a 60 Hz clock 110, a band decoder 120, a display/decoder 130 and a 4 MHz clock 140. An input logic circuit 200 is supplied by the 60 Hz clock and supplies control logic 300 and the fine tuning section 500, specifically fine tune memories 510 and fine tune counters 520. A fine tuning Up/Dn (up/down) switch 150 and a channel Up/Dn switch 160 are connected to input logic circuit 200. A nominal tuning section 400 includes an accumulator means 401, tuning information memories 410, a pair of comparators 430 and 440 and counters 420.

Control logic 300 supplies display/decoder 130, band decoder 120, accumulator means 401, and tuning memories 510 and 410, the latter being coupled to accumulator means 401 and comparator 440. Band decoder 120 feeds control logic 300 and tuner 100. Accumulator means 401 supplies comparator 430. The other inputs of comparators 430 and 440, and comparator 530 in the fine tuning section, are supplied from counters 420. The information contained in the accumulator means, the tuning information memories and the fine tune counters is read out by the comparators as a plurality of pulse width modulated (PWM) signals $C_o$, $E_o$ and $F_o$ representing nominal tuning information, equalization information, and fine tuning information, respectively. These informations are supplied to tuning voltage generator 60 from which the tuning voltage for tuner 100 is produced. The 4 MHz clock 140 drives control logic 300 and counters 420.

As will be explained in greater detail with reference to the schematic diagrams, tuning information memories 410 include reference or pseudo channel nominal tuning information for the different frequency bands and channel number accessible increment tuning information. When a channel is selected, the initial value nominal tuning information for the band is supplied to the accumulator means along with all increment tuning information between the pseudo channel and the selected channel. There the nominal tuning information for the selected channel is derived by summation of the initial value information and the increment information. The last increment constitutes the equalization information and is made available separately for equalization of secondary tuning voltage sources, such as a source of fine tune information or AFC information. The accumulator means and tuning information memories are interrogated to develop the coarse tuning information $C_o$ and the equalization information $E_o$. Similarly in the fine tune section the $F_o$ signal is produced. The fine tune memories are adjustable via the fine tune switch and fine tune counters with comparators 530 interposed between counters 420 and fine tune counters 520.

INPUT LOGIC 200 (FIG. 2)

Figure 2:
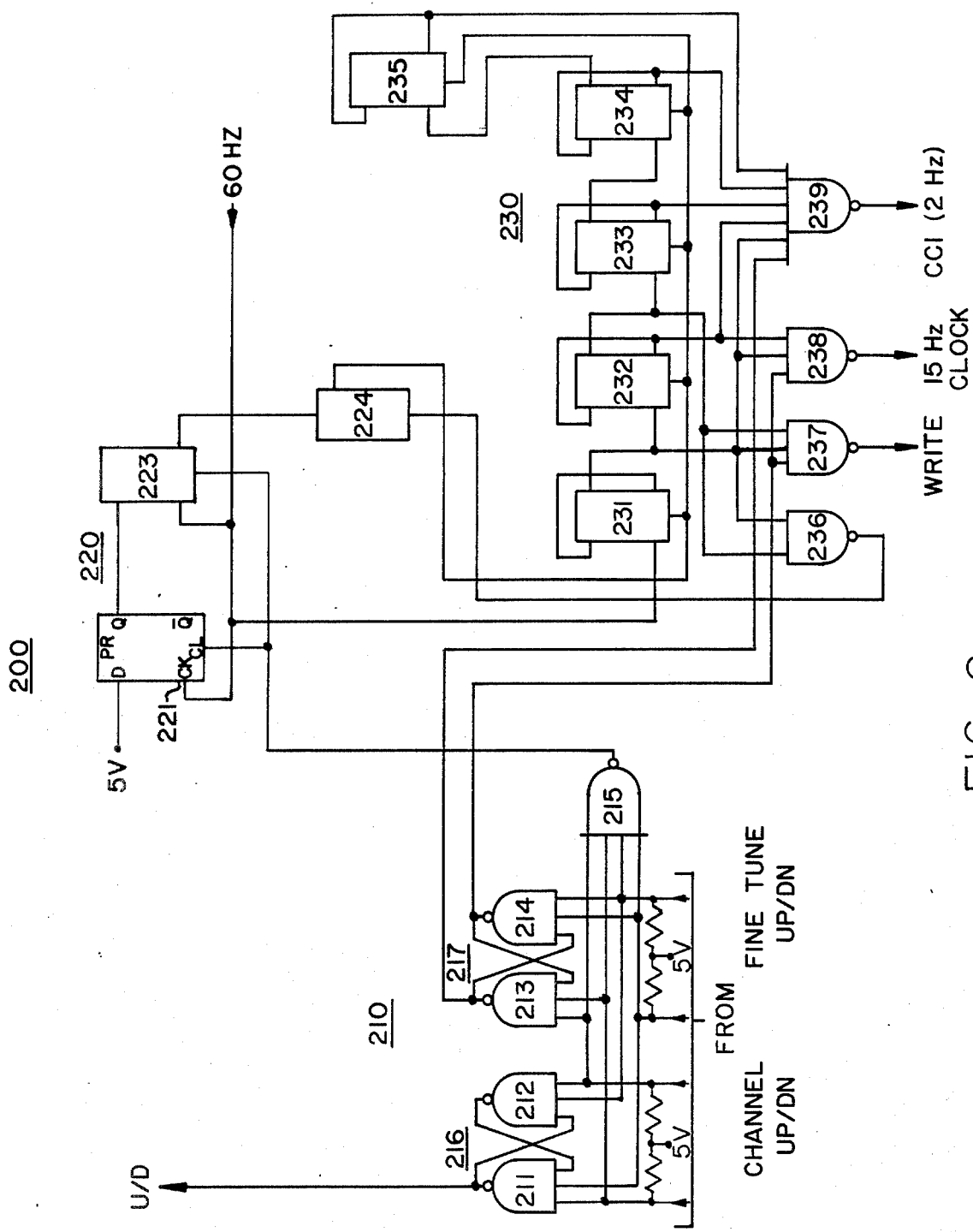
FIG. 2 is a schematic representation of input logic 200.
Figure 3:
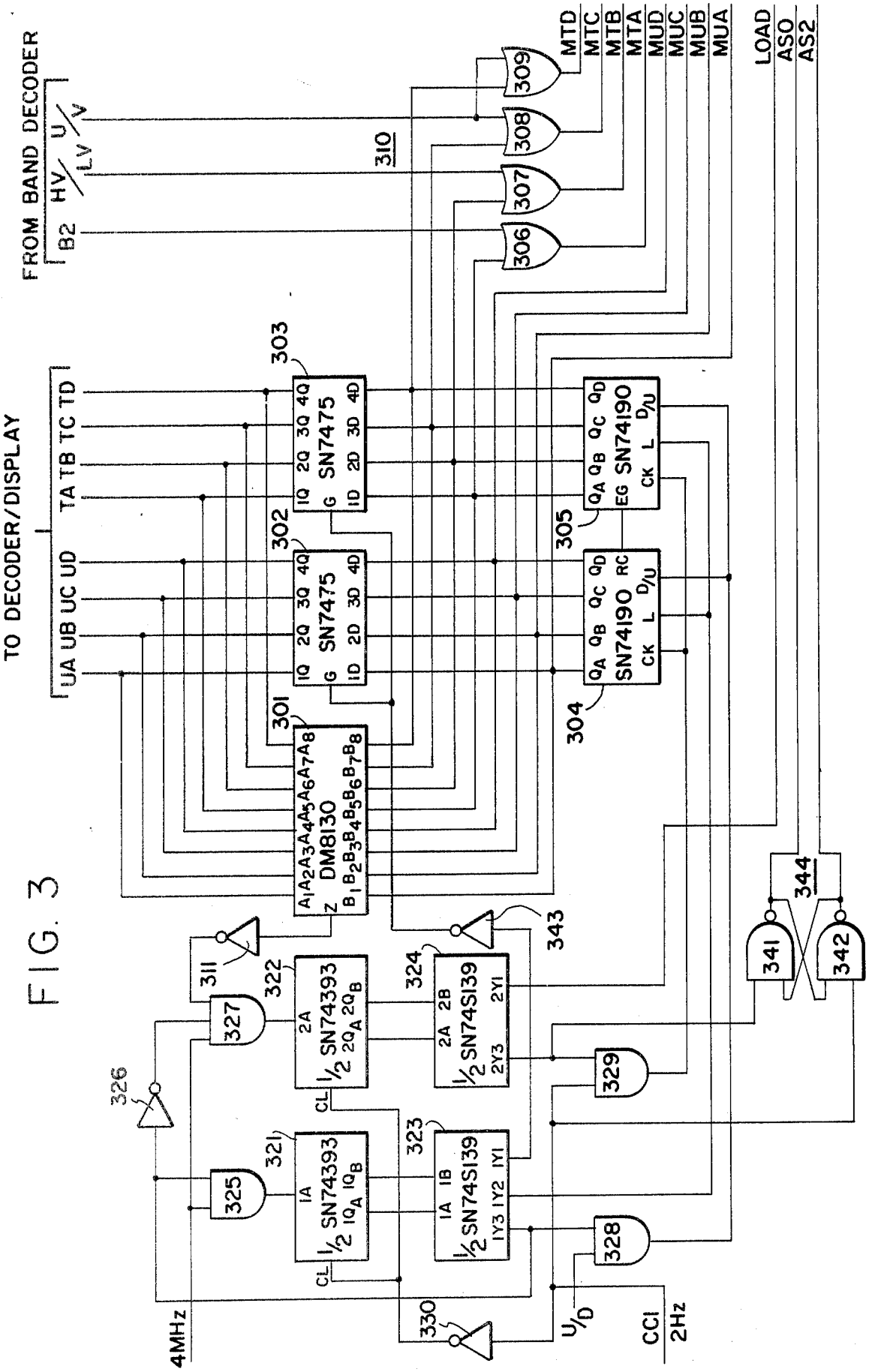
FIG. 3 is a schematic representation of control logic 300.

The input logic circuit 200 of FIG. 2 includes an input latch circuit 210 comprising two pairs of cross-coupled NANDS 211-212, and 213-214 and an initiation circuit NAND 215. Each input to the latch circuit is tied to 5 V through an appropriate resistor for noise immunity. NANDS 211 and 212 form an RS flip flop 216 for producing and maintaining a U/D (up/down) signal in response to actuation of the channel Up/Dn switch or the fine tune Up/Dn switch. NANDS 213 and 214 comprise an RS flip flop (FF) 217 for enabling the gates controlling the channel change initiate (CCI) pulse of approximately 2 Hz and the fine tune write and clock signals of 15 Hz. As its name implies, initiation NAND 215 starts the 60 Hz countdown counters operating in response to either a channel Up/Dn signal or a fine tune Up/Dn signal.

A "deglitch" circuit 220 comprises a FF 221 and a FF 223 for preventing contact bounce or the like from initiating a channel change or fine tune cycle. FF 224 assures completion of a cycle, once started. Deglitch circuit 220 cooperates with input latch 210 and the 60 Hz clock pulses for controlling operation of countdown counter 230, comprising five serially connected FF's 231-235, which develops the low frequency fine tune write, fine tune clock and channel change initiate signals. Three NANDS 237-239 are arranged to decode the different counter states and produce appropriate frequency clocking signals. NAND 236 assures production of the write pulse before allowing counter 230 to terminate operation.

In detail, one pole of the channel Up/Dn switch is coupled to a first input each of NANDS 211, 213 and 215, the other pole being coupled to a first input of NAND 212 and second inputs of NANDS 213 and 215. One pole of the fine tune Up/Dn switch is coupled to a second input of NAND 211, a first input of NAND 214 and a third input of NAND 215. The other pole is coupled to a second input of each of NANDS 212 and 214 and the last input of NAND 215. As mentioned, NANDS 211 and 212 are also cross-coupled (output of each connected to an input of the other) to form RS FF 216. The output of NAND 211 produces the U/D signal. Similarly NANDS 213 and 214 are cross-connected to form RS FF 217. The output of NAND 213 is connected to an input of CCI signal NAND 239 and the output of NAND 214 is coupled to an input each of fine tune NANDS 237 and 238. These RS FF outputs enable the respective connected NANDS.

The output of initiation circuit NAND 215 is coupled to the CL terminals of FF 221 and FF 223. D of FF 221 is connected to 5 V; its Q output being connected to D of FF 223. A 60 Hz clock signal is connected to the CK terminals of FF's 221 and 223 and also to the CK terminal of FF 231 in counter 230. $\bar{Q}$ of FF 223 is coupled to PR of FF 224, the Q output of which provides a reset signal for FF's 231-235 in counter 230.

The FF's in counter 230 are arranged conventionally with the Q of the first FF 231 coupled to the CK of the second FF 232, and so forth. The $\bar{Q}$ terminals of each flip flop are connected to the D terminals of the same flip flop. Q of 231 is connected to a first input of NAND 236 and second inputs of NANDS 237-239. Q of FF 232 is connected to a second input of NAND 236 and a third input of NAND 237. $\bar{Q}$ of FF 232 is connected to a third input of NAND 238 and 239. The $\bar{Q}$'s of FF's 233-235 are each connected to further input of NAND 239. As mentioned, all of the CL reset terminals for FF's 231-235 are connected to the Q terminal of FF 224. The output of NAND 237 supplies the 15 Hz fine tune write signal, the output of NAND 238 the 15 Hz fine tune clock signal and the output of NAND 239 the approximately 2 Hz CCI signal. The output of NAND 236 is connected back to CL of FF 224.

CONTROL LOGIC 300 (FIG. 3)

Operation of the channel Up/Dn switch produces a U/D signal for the channel number counters which determines the direction of counting. A channel-change-initiate) (CCI) signal is also produced and enables a four-state counter and decoder arrangement which is clocked at a 4 MHz rate. The counter is reset to its first state by the CCI signal. In the second state it fixes the new channel number in the units and tens latches. In state 3 the channel counters are reset to zero and in state 4 the state counter is disabled.

Disabling of the state counter enables a four-state addition control counter and decoder which were also reset to state 1 by the CCI signal. In state 2 the registers in the accumulator means are "loaded" with the outputs of the arithmetic logic units (also in the accumulator means) and in state 4 the channel counters are stepped one count. State 3 is not used. The addition control counter continues to cycle through its states and adds the contents of each accessed memory location into the accumulators until the channel counters match the number stored in the latches. A comparator determines when this condition occurs and disables the system. The information then in the accumulators represents the nominal tuning information for the selected channel number in the latches.

In detail, a comparator 301 is connected between the outputs of a pair of channel counters 304-305 and channel number latches 302-303. The outputs of the latches are also connected to display/decoder 130 and band decoder 120 in FIG. 1. Latch 302 presents the binary coded decimal (BCD) units digit (UA-UD) at its 1Q-4Q terminals. Latch 303 presents the BCD ten digits TA-TD at its 1Q-4Q terminals. 1Q-4Q of latch 302 are connected to $A_1$-$A_4$, respectively, of comparator 301 and 1Q-4Q of latch 303 are connected to $A_5$-$A_8$. On the counter side, $Q_A$-$Q_D$ of counter 304 are connected to $B_1$-$B_4$ respectively and $Q_A$-$Q_D$ of counter 305 connected to $B_5$-$B_8$, respectively. Units counter 304 has its $Q_A$-$Q_D$ output terminals connected to the 1D-4D input terminals of latch 302 and tens counter 305 has its $Q_A$-$Q_D$ terminals connected to 1D-4D of latch 303. The BCD units digit is conveyed directly to the tuning information memories over leads MUA-MUD. As will be explained under "Memory Organization", the BCD tens digit is supplied through OR gates 306-309 in a memory address translator 310. The other inputs of these OR gates are supplied from the band decoder. The U/V line is high for VHF, HV/LV is high for channels 2-6 and B2 is high for channels 5 and 6. The translator outputs go to the tuning information memories over leads labelled MTA-MTD.

The reset (CL) terminals of state counter 321 and addition control counter 322 are connected together and supplied with the 2 Hz CCI signal through an inverter 330. An AND 325 and an AND 327 supply clock terminals 1A and 2A respectively of counters 321 and 322. One input of each of these ANDS is supplied with a 4 MHz signal. The second input of AND 325 is coupled to terminal 1Y3 of state decoder 323 and, through an inverter 326, to a second terminal of AND 327. The last input of AND 327 is supplied, through an inverter 311, from the Z terminal of comparator 301.

The $1Q_A$ and $1Q_B$ outputs of state counter 321 are coupled respectively to the 1A and 1B inputs of state decoder 323. Similarly, the $2Q_A$ and $2Q_B$ outputs of addition control counter 322 are coupled to the 2A and 2B inputs of state decoder 324. The 1Y1 output of state decoder 323 is connected, through an inverter 343, to the G terminals of latches 302 and 303. The 1Y2 terminal is connected to the L terminals of channel counters 304 and 305 and the 1Y3 terminal connected to an input of AND 328. The other input of AND 328 is supplied with the U/D signal. The 2 Hz CCI signal is coupled to a first input each of AND 329 and NAND 342. ANDS 328, 329 supply D/U and CK of counters 304, 305. The 2Y1 output of state decoder 324 carries the load signal for the accumulators. The 2Y3 output is connected to the second input of AND 329 and an input of a NAND 341. NANDS 341 and 342 are cross-coupled and form an RS FF 344. The output of NAND 341 carries the AS0 signal and the output of NAND 342 carries the AS2 signal for the accumulators. As will be explained, the AS0 and AS2 signals determine the operating mode of the accumulators.

NOMINAL TUNING INFORMATION SECTION 400 (FIG. 4)

The nominal tuning section contains the accumulators and the tuning information memories as well as the comparators and counters for reading out their contents. These memories include reference channel nominal tuning information for each frequency band and increment tuning information for each channel. The system may be best understood by considering the memory organization at the same time the nominal tuning information computation is discussed.

MEMORY ORGANIZATION

The commercially available memory disclosed can store 256 words and is addressed by 8 lines. Four lines are for the BCD units digit (MUD, MUB, MUC and MUA) and four lines for the BCD tens digit (MTD, MTC, MTB and MTA). The memories are schematically shown for simplicity. Their internal arrangements are well-known in the art. The FCC allocated channel numbers for the television frequency spectrum extend from 2-83. The arrangement enables storage and retrieval of initial value tuning information for each of the frequency bands as well as the slope (increment) information for the individual channels in the bands with very minimal structure. Each four bits defines 16 binary states which may be labelled (using hexadecimal notation) as 0, 1, 2, ... 9, A, B, C, D, E, F. Each memory location thus has an "x" (tens) and a "y" (units) coordinate, each of which ranges from 0-F. The address of memory location 1 is 00, whereas the address of location 256 is FF.

The BCD units digit from the channel number counters is supplied directly to the corresponding units inputs in the memories. The BCD tens digit is routed through the four OR gates in the memory address translator, the other inputs of which are supplied from the band decoder. For VHF channels the band decoder forces certain of the OR gate outputs to access displaced memory locations. For UHF, the BCD tens digit is directly supplied to the tuning information memories.

In the UHF band (channels 14-83) the pseudo channel 13 nominal tuning information is stored in memory location 13 and tuning information increments to sequentially go to channels 14, 15, 16 ... 83 are stored in memory locations 14-83, respectively. Whereas the addresses of the UHF channel memory locations are straightforward, the VHF channel tuning informations are displaced in the memory by the memory address translator.

For example in the VHF low band (channels 2-4), the pseudo channel 1 nominal tuning information is stored in memory location E1 and tuning information increments to go to channels 2, 3 and 4 are stored in memory locations E2, E3 and E4, respectively. In the VHF mid band (channel 5, 6) the pseudo channel 4 nominal tuning information is stored in memory location F4 and tuning information increments to go to channels 5 and 6 are stored in memory locations F5 and F6, respectively. In the VHF high band (channels 7-13) the pseudo channel 6 nominal tuning information is stored in memory location C6 and tuning information increments to go to channels 7, 8, 9, 10, 11, 12 and 13 are stored in memory locations C7, C8, C9, D0, D1, D2 and D3, respectively. All other memory locations are programmed with zero.

As mentioned, the initial value tuning information is determined from the tuning curve for each band for a pseudo channel 6 MHz below the lowest numbered channel in the band. For channel 2, pseudo channel 1 is used, for channel 5, pseudo channel 4, etc. The increment or slope of the lowest numbered "real" channel represents the tuning voltage change between the pseudo channel in the band and the real channel. Thus, the increment stored for channel 2 is determined by the tuning voltage change needed to go from pseudo channel 1 to real channel 2.

Either a "zero offset" fine tuning system, in which the nominal tuning voltage is selected to lie on the tuning voltage curve, or a ±½ fine tune voltage range offset may be employed. In the former, a ± fine tune voltage is used to vary tuning about the nominal tuning point. In the "offset" system, the nominal tuning voltage is selected to be ½ the fine tuning voltage range above or below the tuning curve. The fine tuning voltage source is thus normally at ½ of its value. The disclosed system incorporates an offset of ½ the fine tune voltage range below the tuning curve.

Similarly, the initial values for the other pseudo channels in the respective bands are determined from the tuning curve at a point 6 MHz below the lowest real channel. The initial value for the UHF band is determined by the tuning information required at pseudo channel 13 (6 MHz below channel 14).

It will also be appreciated that a subtractive approach can readily be envisioned in which the pseudo channels are selected to be 6 MHz above the highest channel in the band and the accumulator arranged to subtract increments from the initial value tuning information.

When a viewer selects a channel for viewing, its number appears in the channel counters, is stored in the latches, the appropriate memory location is accessed (in accordance with the above translation performed by the band decoder and the tens digit signals) and the channel counters are reset to 00. This latter action "sets the stage" for counting through the memory locations and clears the accumulator means of any information stored previously. Thus for channel 2, the memory location initially accessed is E2. Upon reset of the counters, memory location E0 is accessed. The initial tuning information for pseudo channel 1 is stored at memory location E1 and the increment information for channel 2 is stored at memory location E2. The counters are then stepped to match the number in the latches. In so doing, memory locations E0 and E1 are interrogated and their contents added in the register portion of the accumulators. Locations E2 is also interrogated but for the offset system of the preferred embodiment its content is not added in the accumulator. Rather the increment information is used to "equalize" the fine tune information. The fine tune counter is normally set at its mid range and in conjunction with the equalized fine tune information provides the rest of the nominal tuning voltage for channel 2.

Carrying the illustration further, for channel number 5, memory location F5 is accessed and, when the channel counters are reset, memory location F0 is accessed. Initial value tuning information corresponding to pseudo channel 4 is stored at memory location F4 and the channel 5 increment or slope tuning information is stored at memory location F5. As the channel counters are stepped from 00 to 05 (the selected channel number in the latch) memory positions F0–F5 are interrogated, with the informations from F0–F4, inclusive being added along with ½ of the fine tune information, multiplied by the factor of the F5 increment, to arrive at the channel 5 nominal tuning information.

The next band comprises the VHF Hi band (channels 7–13). The initial value tuning information for this band (corresponding to pseudo channel 6) is stored at memory location C6. Assuming channel 9 is selected for viewing, memory locations C0–C9 are serially interrogated. No information is stored at memory locations C0–C5 inclusive. At memory location C6, the initial value information is read out, at memory location C7 the increment for channel 7, at location C8 the increment for channel 8 and at location C9, the increment for channel 9. Thus the channel 9 nominal tuning information is obtained by adding the initial value tuning information for the VHF Hi band, the incremental tuning information for channels 7 and 8 and ½ of the fine tune information equalized by the channel 9 increment.

Finally, for the UHF band, the channel counters access memory location 00 when reset to 00. The initial value tuning information for the lowest UHF band is stored at memory location 143. The increment values for channels 14–83 are stored at memory locations 14–83, respectively. If channel 22 is selected, for example, memory locations 00–22 are interrogated as the channel counters are stepped to match the number 22 stored in the channel number latches. Memory locations 00 through 12, have no information. The increment information at locations 14–21 are added to the initial value tuning information for the band, which is stored at memory location 13, and added to ½ the equalized fine tune information to derive the nominal tuning information for channel 22.

It will be appreciated that in a practical embodiment the memory will be "tailor made" and there will be few, if any, unused memory locations. The channel counters rapidly step from 00 to the number in the latch and all stored information is read out from the accessed memory locations. The counter stepping rate is 1 MHz and the maximum time to derive the nominal tuning information for any channel is 83 microseconds. Thus the system is instantaneous as far as the viewer is concerned.

Three serially connected accumulators 402, 403 and 404 have the load, AS0 and AS2 signals applied to their CK, AS0 and AS2 terminals, respectively. The accumulator is well-known in the art and includes an arithmetic logic unit (ALU) and a storage register. The accumulator specified is capable of performing numerous arithmetic and logic functions. For the present invention only the data transfer and addition modes are used. The memory outputs ae coupled to the inputs of the ALU and the AS0 and AS2 signals control its operational mode. The ALU output is stored in the register under control of the load signal. The summation product is taken from the output of the register. When AS0 is low and AS2 is high, the accumulator is in its transfer mode and the ALU operates to replace the information in the register with the information on the memory output leads upon occurrence of the load signal. When AS0 is high and AS2 is low, the accumulator is in its addition mode and the ALU operates to add the information on the memory output leads to that already in the register and upon occurrence of the load signal, the new sum is stored in the register. Three tuning information memories 412, 413 and 414 have their respective $A_A$–$A_H$ input terminals connected to the MUA–MTD leads from control logic 300. Their D01–D04 output terminals are connected to the A0–A3 input terminals of the respective accumulators. Accumulator 402 has output terminals F0–F3 supplying the $C_1$–$C_4$ signals to the B0–B3 input terminals of a comparator 432. Comparators 433 and 434 are similarly arranged with respect to accumulators 403 and 404, the $C_5$–$C_8$ signals being supplied to comparator 433 and the $C_9$–$C_{12}$ signals to comparator 434. Three counters 422, 423 and 424 have their $Q_A$–$Q_D$ terminals connected to the A0–A3 inputs of comparators 432, 433 and 434, respectively. The comparators are serially connected and the $C_o$ signal—representing nominal tuning information—is taken from comparator 434.

As fully explained in the referent copending application, the comparators have a high value output when the count presented by the counter is less than the information in the memory and a low value for all other counts. The $C_o$ signal appears as a PWM signal with a duration representative of the memory content. Thus the count in the counter is a direct measure of the information at the particular memory location being interrogated.

Similarly comparators 442–444 are arranged to receive the $E_2$–$E_{12}$ signals from tuning information memories 412–414. $E_1$ is connected to ground. The other comparator inputs are connected to counters 422–424, respectively and their output is the $E_o$ signal (taken from comparator 444). It too is a PWM signal, the duration of which is directly related to the memory content. A plurality of inverters enclosed by dashed line box 405 are shown interposed in the $E_1$–$E_{12}$ signal lines. This modification is required when using the tuning voltage generator of FIG. 7. In that case the $E_o$ alternate signal is also used. For the tuning voltage generator of FIG. 6 the inverters and $E_o$ alternate signal should be ignored.

NOMINAL TUNING EXAMPLE

Assume the receiver is tuned to VHF channel number 2 and the viewer decides to change to a different, higher numbered channel, such as VHF channel number 5. When the receiver is tuned to channel 2, latch 302 contains a BCD "0" and latch 303 a BCD "2". The channel number is presented to the viewer via the display/decoder (with or without the leading "0" being blanked) and the band decoder presents appropriate signals to the OR's in memory translator 310, resulting in memory location E2 being accessed, from whence tuning information is received for the tuner. Upon operation of the channel Up/Dn switch, the U/D signal goes low indicating an upward direction change in channel number. The low level U/D signal applied to AND 328 results in a low level output signal to the D/U terminals of channel number counters 304–305, conditioning them for counting up.

It was shown from the control logic in FIG. 2 that the 2 Hz CCI pulse signal is produced at the output of NAND 239. The "1Y3" output of state decoder 323 is low and inhibits AND 325. (AND 327 is inhibited by the inverted Z output of comparator 301.) When state counter 321 is reset, it drives 1Y3 high enabling AND 325 and further inhibiting AND 327.

The CCI pulse is supplied through inverter 330 to state counter 321 and addition control counter 322 to reset them to their respective "1" states. The pulse is also applied to set RS FF 344 such that AS0 is low and AS2 is high, placing the accumulators in the data "transfer" mode (as distinct from the "add" mode). The inverted 2 Hz pulse is applied to AND 329 which increments the channel counters one count, changing their content from 02 to 03.

The 4 MHz clock pulses to state counter 321 are now effective and it cycles to state "2" in which the 1Y1 output goes low, resulting in transfer of the new channel number 03 into the channel number latches. When state "3" is reached, 1Y2 goes low to reset the channel number counters to "00". When 1Y3 goes low in state "4" it forces the channel counters to count in the up direction (overriding the U/D signal) by assuring that the output of AND 328 is low and disables state counter 321 and enables AND 327. At this time the inverted Z output of comparator 301 is high because the number (03) in the latches no longer matches the number (00) in the counters. Addition control counter 322 is clocked to its state "2" by the next 4 MHz pulse. When counter 322 is in state "2", its 2Y1 output is low which instructs the accumulator to "load" any information present on the accessed memory output terminals into the register. If the accumulator is in its transfer mode the memory information displaces any previous information stored in the accumulator. The memory location accessed is E0 and the previous tuning information in the accumulator (corresponding to the nominal tuning information for channel 2) goes to 0 since there is no information at location E0.

When the addition control counter reaches state 4, its 2Y3 output simultaneously switches RS FF 344 and, through AND 329, steps the channel number counters one count to 01. The AS0 output of RS FF 344 goes high and its AS2 output goes low which places the accumulator in the addition mode. Any information at the accessed memory location is added to previous information and stored in the register upon occurrence of a load signal.

Addition control counter 322 continues stepping in response to the 4 MHz clock pulses. When the 2Y1 output of state decoder 324 goes low, the accumulator adds and stores the information present at memory location E1. It will be recalled from the previous discussion that memory location E1 contains pseudo channel 1 nominal tuning information.

Both inputs and the output of AND 329 are normally high. When the CCI signal goes momentarily low, it drives one input of AND 329 low, thus forcing its output low and clocking the channel counters. Similarly, when 2Y3 goes low it clocks the channel counters. Therefore as the addition control counter is cycled between states 2 and 4, the channel counters are stepped one count and the information present on the memory output leads added to the information already in the accumulator. The information stored in the accumulator at this point is 0 from memory location E0 and the pseudo channel 1 nominal tuning information from memory location E1. As the channel number counters are stepped to 02, the increment information for channel 2, which is stored in memory location E2, is added to the information in the accumulator. This sequence continues until the counter is stepped to read 03 corresponding to the channel number stored in the latch.

If the viewer wants channel 4, the Up/Dn switch is held until the display/decoder indicates channel 4. The viewer may of course tune by watching the TV picture instead of the channel number display. Tuning occurs so rapidly that the 2 Hz CCI signal yields more than enough time to completely step through all relevant memory locations for each change in channel number. Thus when channel number 4 is put in the latch, memory locations E0-E4 are interrogated.

Assuming that the viewer releases the Up/Dn channel switch when channel 4 appears on the display or is received by the receiver, the channel number in the latch and the channel number in the counter again match each other and the Z output of comparator 301 goes high which, due to inverter 311, places a disabling signal on AND 327, thus stopping further counting of addition control counter 322.

Those skilled in the art will readily appreciate that because of the extremely high speed at which the information is accumulated there is no discernible tuning time penalty in "summing-from-zero" for each channel number increment.

FINE TUNING SYSTEM 500 (FIG. 5)

This section is substantially identical to that disclosed in the above-mentioned copending application.

In this section, additional counters are employed for electrically altering the corresponding fine tune memories' contents in accordance with viewer preferences. The fine tune memories are interrogated each time a CCI signal is received from the input logic (FIG. 2). The comparators operate in the same manner as the comparators for the tuning information memories. The fine tuning information is automatically updated in the memories by the input logic, responsive to operation of the fine tune Up/Dn switch.

Figure 4:
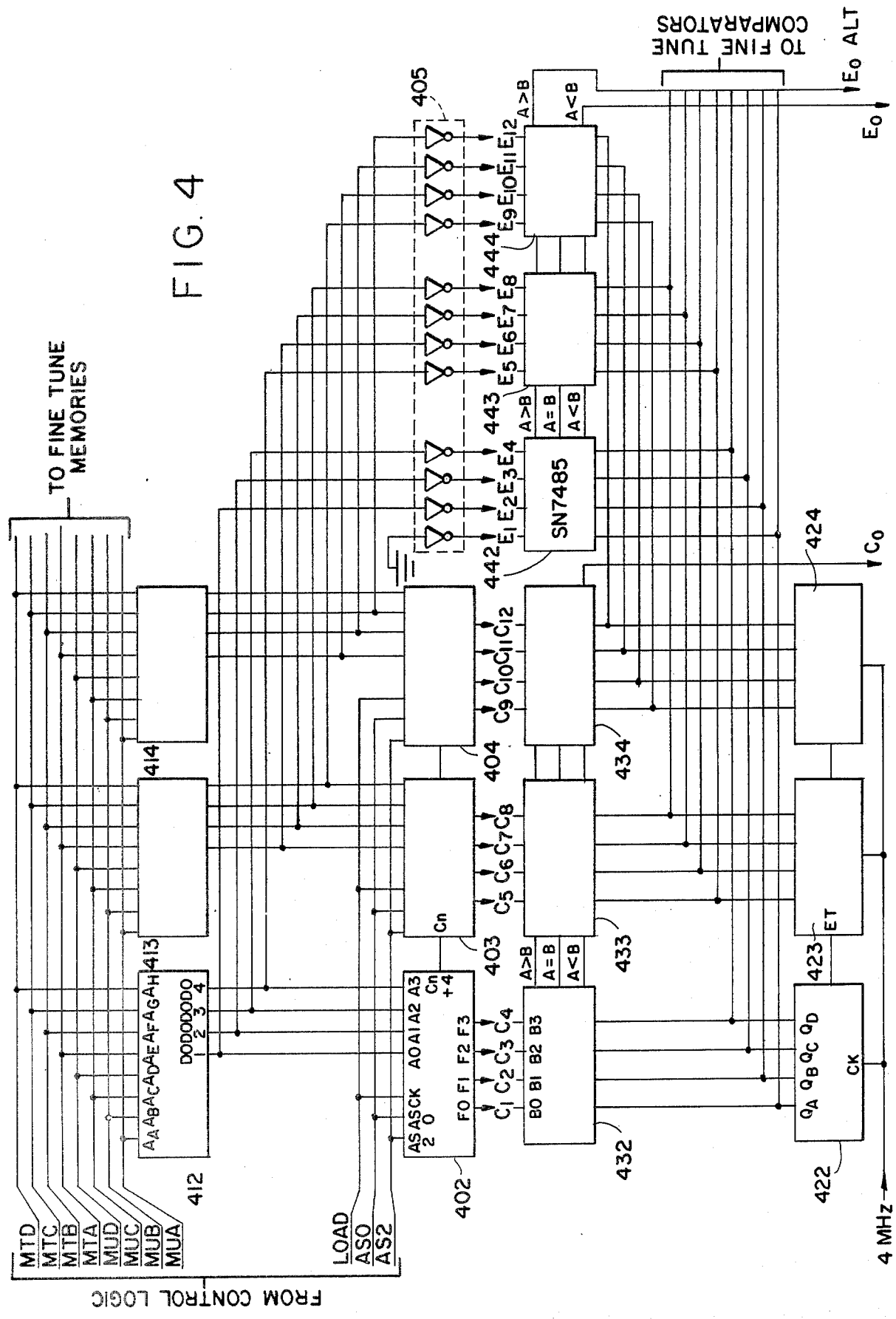
FIG. 4 is a schematic representation of nominal tuning section 400 including accumulator means 401, tuning information memories 410, counters 420 and comparators 430 and 440.

Outputs $Q_A$-$Q_D$ of fine tune counters 522, 523 are connected to input terminals $DI_1$-$DI_4$ of fine tune memories 512, 513 and input terminals B0-B3 of comparators 532, 533. A0-A3 of comparators 532 and 533 are connected to $Q_A$-$Q_D$ of counters 422 and 423 (FIG. 4) respectively. The fine tune write signal is coupled to the R/W terminals of fine tune memories 512 and 513, the U/D signal coupled to the D/U terminals of the fine tune counters 522 and 523 and a 15 Hz clock signal coupled to the CK terminals of the counters. These signals are all supplied from input logic 200.

The $D_A$-$D_D$ of fine tune counters 522, 523 are connected to corresponding inputs of comparators 532, 533 and bear lead designations $F_1$-$F_4$ for comparator 532 and $F_5$-$F_8$ for comparator 533. Outputs $DO_1$-$DO_4$ of memories 512, 513 are connected to inputs $D_A$-$D_D$ of fine tune counters 522, 523, respectively. As the "C" leads were related to the output signal $C_o$, and the "E" leads to the output signal $E_o$, the "F" leads are related to the output signal $F_o$.

As discussed above for the tuning information memories, the memories are individually and simultaneously addressed by the channel number in the channel number counters 304, 305. During operation of counters 422-423 of FIG. 4, output signal $F_o$ is high when the count is less than the fine tune memory content and low when equal to or greater than the memory content. In practice, the count interval is about 1/16 millisecond for $F_o$ and about one millisecond for $C_o$ and $E_o$. The length of time that the $F_o$, $C_o$ and $E_o$ output signals remain at a high logic level is indicative of the memory or accumulator content. When the comparator determines that the counter output is equal to or greater than the memory (or accumulator) content, its output voltage is low and the duration of the high logic level pulse is directly indicative of the stored information. Thus the $C_o$, $E_o$ and $F_o$ signals at the outputs of each of the comparator groups are PWM signals having duty cycles proportional to the digital information stored in the memories and accumulator.

TUNING VOLTAGE GENERATOR 60 (FIGS. 6-9)

Figure 6:
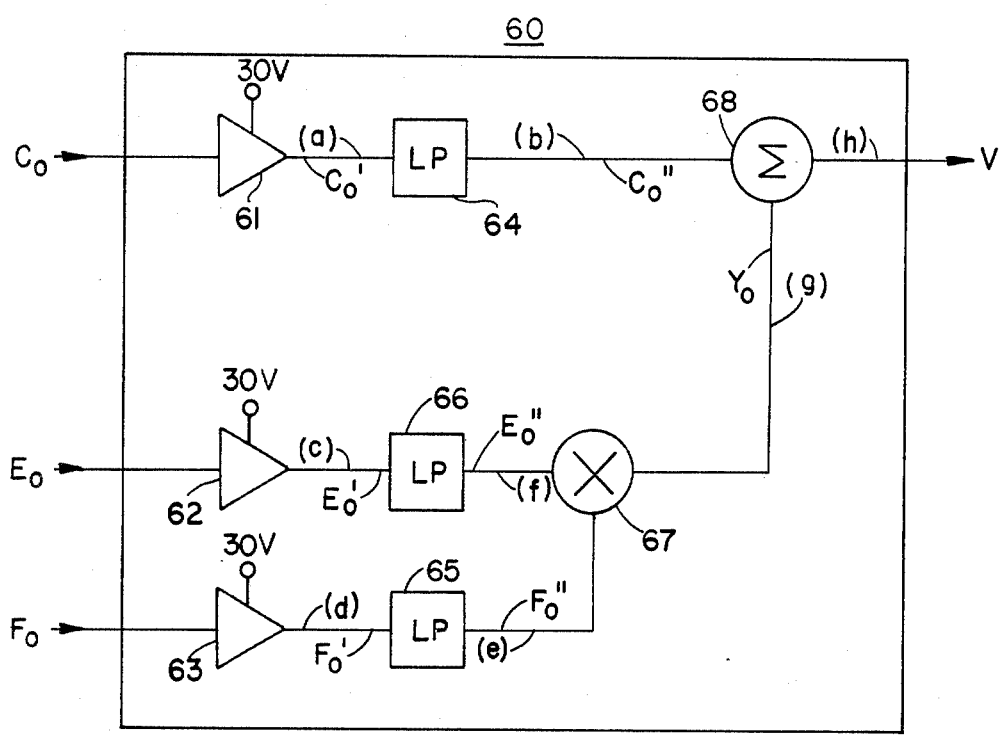
FIG. 6 is a representation of one form of tuning voltage generator 60.

FIG. 6 depicts one implementation of tuning voltage generator 60. The PWM signals $C_o$, $E_o$ and $F_o$ are respectively coupled through a plurality of buffer amplifiers 61, 62 and 63 to produce level shifted PWM signals $C_o'$, $E_o'$ and $F_o'$. Such amplifiers are commonly known in the art and serve to amplify square wave input signals, for example, to the level of the indicated source voltage—in this instance 30 volts. For example, a Texas Instruments type SN7407 device with a "pull-up" resistor to 30 volts may be used. $C_o'$, $F_o'$ and $E_o'$ are supplied to low pass filters 64, 65 and 66 where they are converted into steady state voltages $C_o''$, $F_o''$ and $E_o''$ respectively. $F_o''$ is used as the source for a multiplier 67 to which $E_o''$ is supplied, producing an output signal $Y_o$. $Y_o$ is fed along with $C_o''$ to a summation circuit 68. The final tuning voltage V is produced at the output of operational amplifier summation circuit 68 for application to the tuner. Multiplier 67 is also well-known in the art and may be type MC1594L available from Motorola Inc. It will be appreciated by those skilled in the art that the $E_o''$ and $F_o''$ signals must be normalized by the source voltage (30 v) in multiplier 67 to maintain the proper level for combination with $C_o''$.

Figure 5:
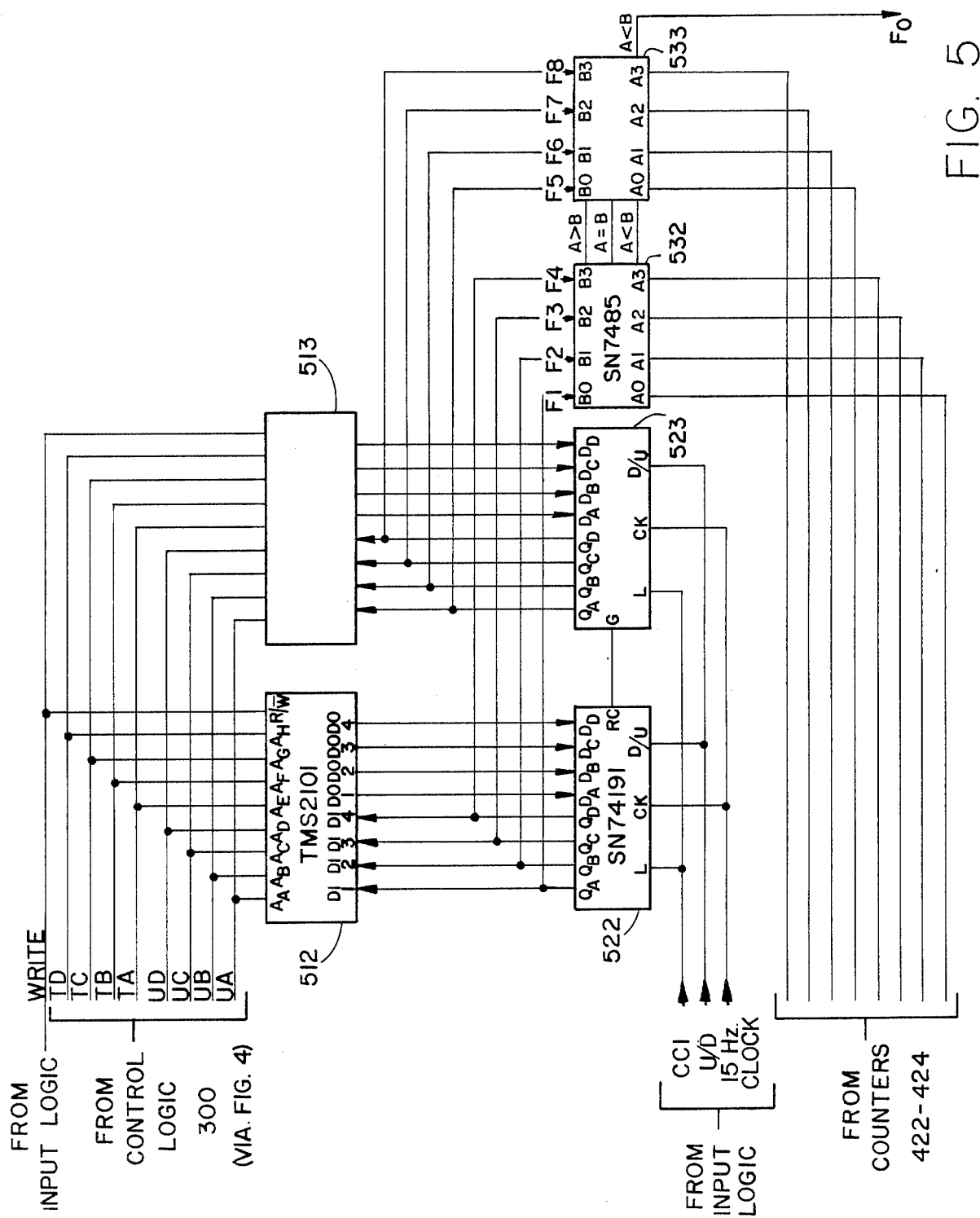
FIG. 5 is a schematic representation of the fine tuning section 500 including fine tune memories 510, fine tune counters 520 and comparator 530.
Figure 8:
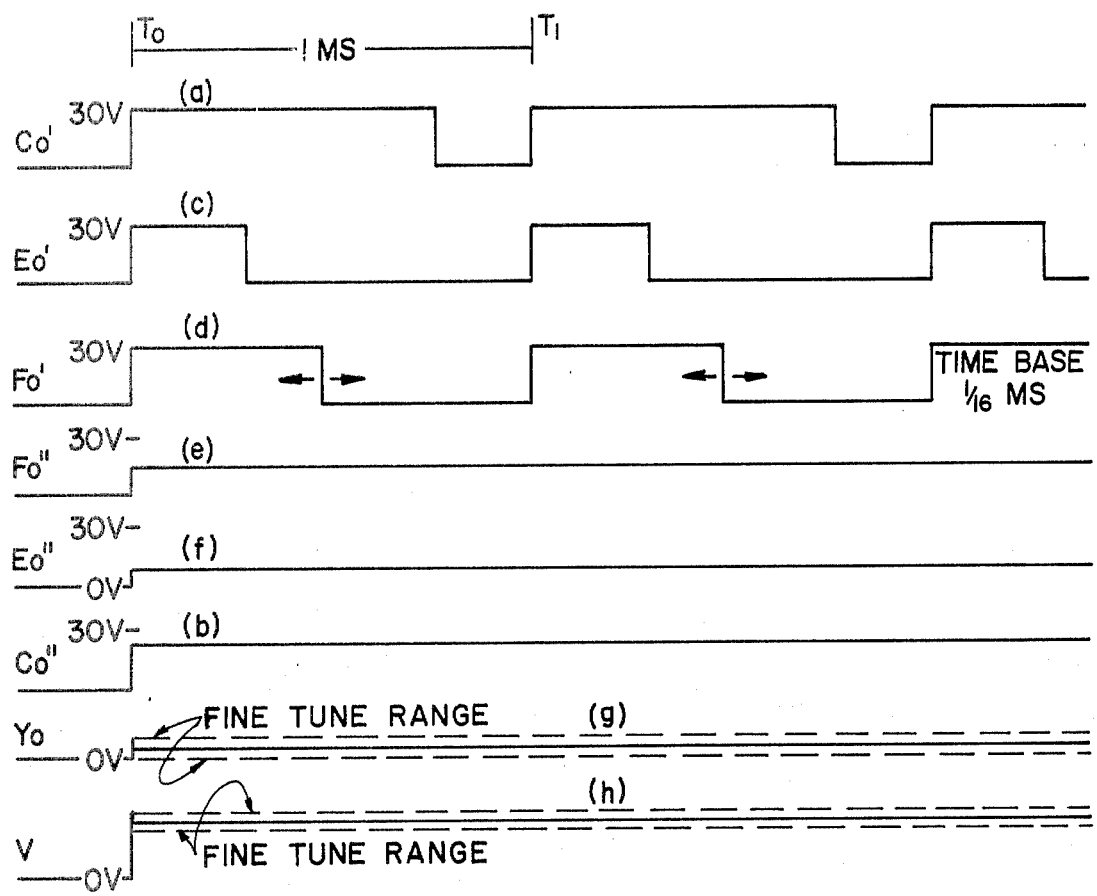
FIG. 8 shows the waveforms associated with the tuning voltage generator of FIG. 6.

Reference to FIG. 8 will help clarify circuit operation. The curves indicated by letters (a) through (h), (and correspondingly marked on the diagram of FIG. 4), indicate the various waveforms of representative signals. $C_o'$ is a pulse of 30 volts amplitude. For the assumed condition, it extends for the major portion of the $T_0$-$T_1$ time cycle (approximately one millisecond in duration). $E_o'$ is a pulse of similar amplitude but (for the assumed condition) of more limited duration. Similarly $F_o'$ has a 30 volt amplitude but a variable duration as indicated by the oppositely-directed horizontal arrows. It should be noted that the time cycle for $F_o'$ is about 1/16 of that shown. For any given channel $C_o'$ and $E_o'$ are fixed quantities corresponding to nominal tuning and slope factor or increment information from accumulator 402-404 and information memories 412-414 respectively, of FIG. 4. The duration of $F_o'$ is determined by the digital information stored in memories 512 and 513 of FIG. 5. The $E_o''$, $F_o''$ and $C_o''$ curves are believed self-explanatory and consist of DC voltages of an amplitude (between 0 and 30 volts) dictated by the duty cycles of the respective $E_o'$, $F_o'$ and $C_o'$ signals. $Y_o$ is $F_o''$ that has been multiplied by $E_o''$ and divided by the source voltage of 30 volts. The $Y_o$ signal has a limited amplitude which represents the permissable fine tuning range. The tuning voltage V is a summation of $Y_o$ and $C_o''$ and is the voltage actually applied to the tuner of the television receiver.

Figure 7:
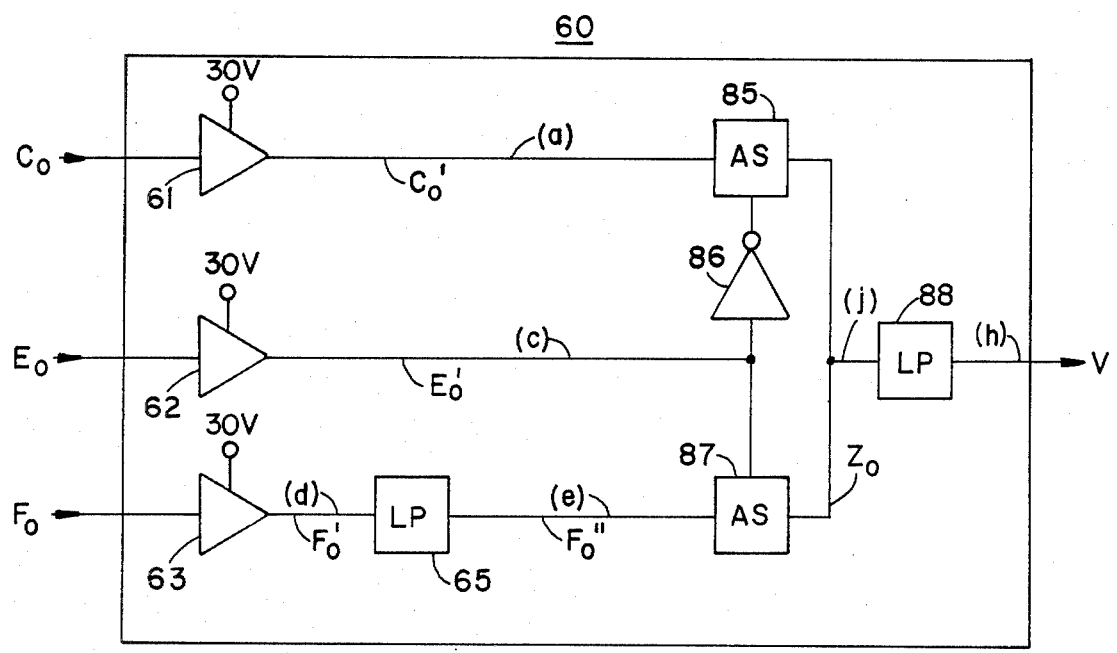
FIG. 7 is a representation of another form of tuning voltage generator 60.

FIG. 7 represents another implementation of tuning voltage generator 60. The $C_o$, $E_o$ and $F_o$ signals are amplified by amplifiers 61, 62 and 63 as described with reference to FIG. 6. The $C_o'$ signal is supplied to a conventional analog switch 85. The $E_o'$ signal is applied through an inverter 86 to analog switch 85. $F_o'$ is supplied to a low pass filter 65 to produce a filtered $F_o''$ signal which is applied to an analog switch 87. $E_o'$ is coupled directly to analog switch 87. The $E_o'$ signal functions as a gate to the analog switches. When it is high (30 volts) it allows $F_o''$ to go through analog switch 87 (and closes analog switch 85) and when low allows $C_o'$ to go through analog switch 85 (and closes analog switch 87) the outputs of analog switches 85 and 87 are combined and applied to a low pass filter 88 which produces the final tuning voltage V shown as waveform (h).

Figure 9:
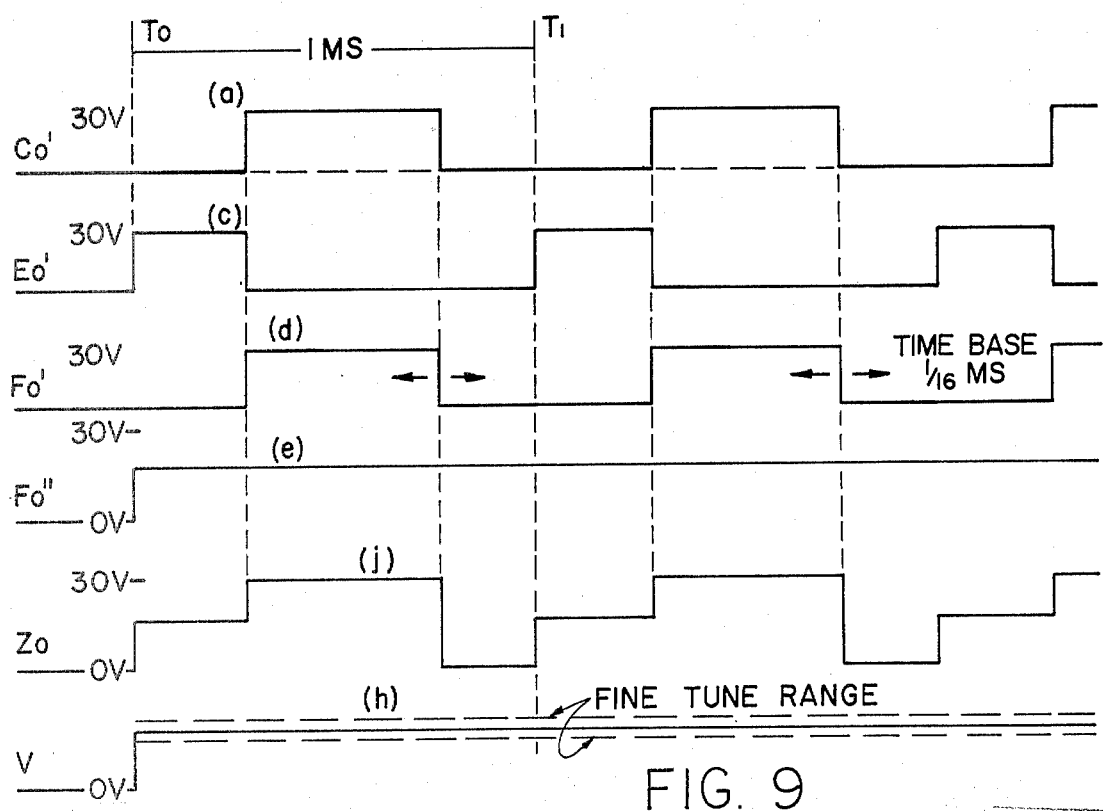
FIG. 9 shows the waveforms associated with the tuning voltage generator of FIG. 7.

The $C_o'$, $E_o'$, $F_o'$ and $F_o''$ waveforms of FIG. 9 are similar to those in FIG. 8. The differences are due to the manner of combining the fine tune voltage to the nominal tuning voltage i.e., analog voltage summation vs. time frame summation. Waveform $Z_o$ represents a combination of $C_o'$ and $F_o''$ and when filtered produces the actual V tuning voltage which is identical to V produced by FIG. 6 implementation.

The illustration of these two tuning voltage generators should show clearly the functional aspects involved. It will be obvious to those skilled in the art that other implementations may readily by used. The particular arrangements are believed well within the scope of the art and are not considered a part of this invention.

The fine tune voltage counters are assumed to be set at the midpoint of their range. In this condition, they develop one-half of the fine tuning voltage available. (The magnitude of fine tuning voltage produced will, of course, depend upon the area of the tuning curve). The nominal tuning voltage is offset from the tuning curve by the equalized contribution of the fine tuning voltage. In a zero offset system, with a ± fine tuning voltage arrangement, the nominal tuning voltage would lie on the curve. In the specification and claims the term "nominal tuning" should be understood to embrace offset systems as well as those having a fine tuning range centered on zero. Similarly it should be obvious that the DC level of an AFC voltage coupled to the system may need to be offset.

What has been described is a novel method of memory saving and apparatus for a television tuning system in which nominal tuning information for a reference channel in each band is stored along with increment tuning information for each channel. Nominal tuning information for any selected channel is computed from the appropriate reference channel nominal tuning information and increment tuning information.

What is claimed is:

1. A television tuning system including:
    a voltage controlled tuner having a nonlinear tuning voltage-versus-frequency characteristic;
    memory means storing both reference tuning information, and increment tuning information related to the slope of said characteristic at each channel, said reference tuning information comprising nominal tuning information for a reference channel and said increment tuning information representing the changes in nominal tuning information between adjacent channels;
    tuning voltage means generating a tuning voltage for said tuner;
    channel address means accessing said memory means for tuning to a selected channel and reading out the corresponding tuning informations; and
    accumulator means coupled between said memory means and said tuning voltage means algebraically adding tuning information increments to said reference tuning information to derive the nominal tuning information for the selected channel.

2. A television tuning system as set forth in claim 1 wherein the reference channel tuning information is for a channel at one extremity of the frequency band.

3. A television tuning system as set forth in claim 2 wherein the reference channel tuning information corresponds to a pseudo channel 6 MHz below the lowest numbered channel in said band, and wherein said accumulator means adds tuning voltage increment information to the pseudo channel tuning information to derive the nominal tuning information for the selected channel.

4. A television tuning system as set forth in claim 3, further including a source of secondary tuning information;
means proportioning said secondary tuning information by the last increment of tuning information; and
means combining said derived nominal tuning information for the selected channel with the proportioned secondary tuning information.

5. The method of operating a television tuning system including a tuner having a nonlinear tuning voltage-versus-frequency characteristic and a channel-number-accessible memory for storing tuning information, comprising the steps of:
storing in said memory reference tuning information comprising nominal tuning information for a reference channel and tuning increment information representative of the change in nominal tuning information between successive channels;
computing nominal tuning information for the selected channel by reading out from said memory and algebraically summing tuning increment informations and the reference channel tuning information to derive the nominal tuning information for the selected channel; and
producing a tuning voltage therefrom for said tuner.

6. The method of claim 5 wherein the reference channel is a pseudo channel spaced one channel below the lowest numbered channel in the band and wherein said summing step includes the further step of:
adding the tuning increment information of successive higher channels to the nominal tuning information of said pseudo channel.

7. The method of claim 6 further including the steps of:
proportioning a source of secondary tuning information with the tuning increment information corresponding to the selected channel; and
combining the nominal tuning information for the selected channel with the proportioned secondary tuning information for producing the tuning voltage for said tuner.

8. The method of operating a television tuning system including a tuner having a nonlinear tuning voltage-versus-frequency characteristic, a channel-number-accessible memory for storing tuning information, an arithmetic logic unit and a storage register comprising the steps of:
storing in said memory
(a) nominal tuning information for a pseudo channel having a frequency 6 MHz below the lowest numbered channel in the frequency band, and
(b) increment tuning information for each channel corresponding to the tuning information change between successive channels including the pseudo channel;
interrogating said memory for a desired channel to read out said pseudo channel tuning information and one or more of said increment informations;
computing the nominal tuning voltage information for said desired channel from said pseudo channel information and said increment information by operating said arithmetic logic unit to combine said nominal tuning information for said pseudo channel and said increment information in said storage register, and
producing a tuning voltage therefrom for said tuner.

9. The method of claim 8 further including a channel number counter and a channel number latch, said method further comprising the steps of:
latching the desired channel number in the latch;
resetting the channel number counter and clearing the register;
operating the channel number counter to count up to the number in the latch; and
interrogating said memory to read the appropriate tuning information into the register as the counter is stepped.

10. The method of claim 9 further including a viewer operated channel Up/Dn switch for controlling the counter and means displaying the channel number in the latch to the viewer, the steps of:
automatically replacing the number in the latch with the new channel number in the counter at a given repetition rate in response to operation of the Up/Dn switch; and
repeating said interrogating and computing steps for each new channel number, said latter steps taking significantly less time to perform than the period of said given repetition rate.

11. A television tuning system including a voltage-controlled tuner having a nonlinear voltage-versus-frequency characteristic and a memory having a plurality of accessible locations;
one of said locations storing nominal tuning information for a reference channel;
others of said locations storing increment tuning information representative of changes in nominal tuning information between said reference channel and the next adjacent channel and between successive pairs of adjacent channels;
a channel number counter for accessing said different memory locations in accordance with channel numbers;
accumulator means coupled to said memory for developing nominal tuning information for a selected channel by reading out and combining said nominal tuning information for said reference channel with all increment informations between said reference channel and said selected channel; and
a tuning voltage generator coupled to said accumulator means for generating a tuning voltage for said tuner from said developed nominal tuning information.

12. A television tuning system as set forth in claim 11 wherein said reference channel is a pseudo channel selected at a point on said characteristic 6MHz below the frequency corresponding to the lowest numbered channel in the band.

13. A television tuning system as set forth in claim 12 further including control logic means comprising a channel number latch;
a high speed clock;

state counter means driven by said clock for resetting said channel number counter after a channel number change has been stored in said latch and for operating said channel number counter until its count matches the number in said latch; and comparator means disabling said state counter means when the channel number counter counts to the number in said latch.

14. A television tuning system as set forth in claim 13 wherein said accumulator means includes an arithmetic logic unit and a storage register;

said arithmetic logic unit either substituting information in said register or adding information to previous information therein under control of said state counter means.

15. A television tuning system as set forth in claim 14 including means displaying the channel number in the latch and a viewer-operable Up/Dn switch for producing a channel change initiate signal for said control logic means;

said initiate signal comprising a pulse train of predetermined periodicity and changing the count in said channel number counter;

said state counter means being activated by said initiate signal for latching the new channel number, resetting said channel counter, driving said channel counter from its reset count to the count stored in the latch and disabling itself when the number in the channel counter matches the number in the latch.

16. A television tuning system as set forth in claim 15 wherein said state counter means cycles once for each count change in the channel counter, the maximum cycle time of the state counter means being less than the predetermined periodicity of said pulse train.

17. An all-channel television tuning system including a voltage controlled tuner having a nonlinear voltage-versus-frequency characteristic and a memory having a plurality of locations each accessible by a distinct channel number, said channels being numbered consecutively but lying in more than one distinct frequency band;

one of said locations in each distinct frequency band storing nominal tuning information for a reference channel in its associated band;

others of said locations in each band storing increment tuning information representative of changes in nominal tuning information between the associated reference channel and the next adjacent channel and between successive pairs of adjacent channels in each band;

a channel number counter;

accumulator means coupled to said memory for developing nominal tuning information for any selected channel by combining the nominal tuning information for its associated reference channel with increment tuning information between the associated reference channel and the selected channel;

a tuning voltage generator coupled to the said accumulator means for generating a tuning voltage for said tuner from said developed nominal tuning information;

band decoder means determining the proper frequency band for each channel number; and memory location translation means for allocating blocks of memory locations to said different frequency bands.

18. An all-channel television tuning system as set forth in claim 17 wherein said channel number counter generates a BCD tens digit and a BCD units digit corresponding to the respective digits of the selected channel number, said units digits being coupled directly to said memory and said tens digit being routed through said memory location translation means along with the output of said band decoder means.

19. An all-channel television tuning system as set forth in claim 18 wherein said reference channels comprise pseudo channels selected to be 6MHz below the lowest channels in each band.

* * * * *